(12) United States Patent
Hwang et al.

(10) Patent No.: US 12,364,018 B2
(45) Date of Patent: Jul. 15, 2025

(54) LIMITED LATERAL GROWTH OF S/D EPI BY OUTER DIELECTRIC LAYER IN 3-DIMENSIONAL STACKED DEVICE

(71) Applicant: Samsung Electronics Co., Ltd., Suwon-si (KR)

(72) Inventors: Inchan Hwang, Schenectady, NY (US); Jaejik Baek, Watervliet, NY (US); Byounghak Hong, Albany, NY (US); Saehan Park, Clifton Park, NY (US); Kang-ill Seo, Albany, NY (US)

(73) Assignee: Samsung Electronics Co., Ltd., Yongin-si (KR)

( * ) Notice: Subject to any disclaimer, the term of this patent is extended or adjusted under 35 U.S.C. 154(b) by 458 days.

(21) Appl. No.: 17/866,343

(22) Filed: Jul. 15, 2022

(65) Prior Publication Data

US 2023/0335549 A1 Oct. 19, 2023

Related U.S. Application Data

(60) Provisional application No. 63/332,206, filed on Apr. 18, 2022.

(51) Int. Cl.
*H10D 88/00* (2025.01)
*H10D 64/01* (2025.01)
*H10D 84/03* (2025.01)

(52) U.S. Cl.
CPC .......... *H10D 88/00* (2025.01); *H10D 64/017* (2025.01); *H10D 64/021* (2025.01); *H10D 84/038* (2025.01); *H10D 88/01* (2025.01)

(58) Field of Classification Search
CPC .... H10D 88/00; H10D 64/017; H10D 64/021; H10D 88/01; H10D 84/038
USPC .......................................................... 257/324
See application file for complete search history.

(56) References Cited

U.S. PATENT DOCUMENTS

| | | | |
|---|---|---|---|
| 9,882,027 | B2 | 1/2018 | Liao et al. |
| 10,978,573 | B2 | 4/2021 | Yogendra et al. |
| 11,177,258 | B2 | 11/2021 | Xie et al. |
| 2021/0242125 | A1* | 8/2021 | Do ...................... H10D 62/121 |
| 2021/0349691 | A1 | 11/2021 | Hekmatshoartabari et al. |
| 2021/0366907 | A1 | 11/2021 | Liao et al. |
| 2021/0407999 | A1 | 12/2021 | Huang et al. |

(Continued)

*Primary Examiner* — Phuc T Dang
(74) *Attorney, Agent, or Firm* — Lewis Roca Rothgerber Christie LLP

(57) ABSTRACT

An integrated circuit includes a first semiconductor device and a second semiconductor device adjacent to the first semiconductor device. Each of the first and second semiconductor devices includes a lower transistor and an upper transistor on the lower transistor, and the upper and lower transistors each include a source region, a drain region, and a channel region extending between the source region and the drain region. The integrated circuit also includes a first dielectric spacer extending along an inner sidewall of the channel region of the upper and/or lower transistor of the first semiconductor device, a second dielectric spacer facing the first dielectric spacer and extending along an inner sidewall of the channel region of the upper and/or lower transistor of the second semiconductor device. The integrated circuit also includes an interconnect contact between the first semiconductor device and the second semiconductor device.

12 Claims, 10 Drawing Sheets

(56) References Cited

U.S. PATENT DOCUMENTS

2022/0020647 A1    1/2022  Lin et al.
2023/0142609 A1*   5/2023  Yim .................. H10D 30/6735
                                                       257/347

* cited by examiner

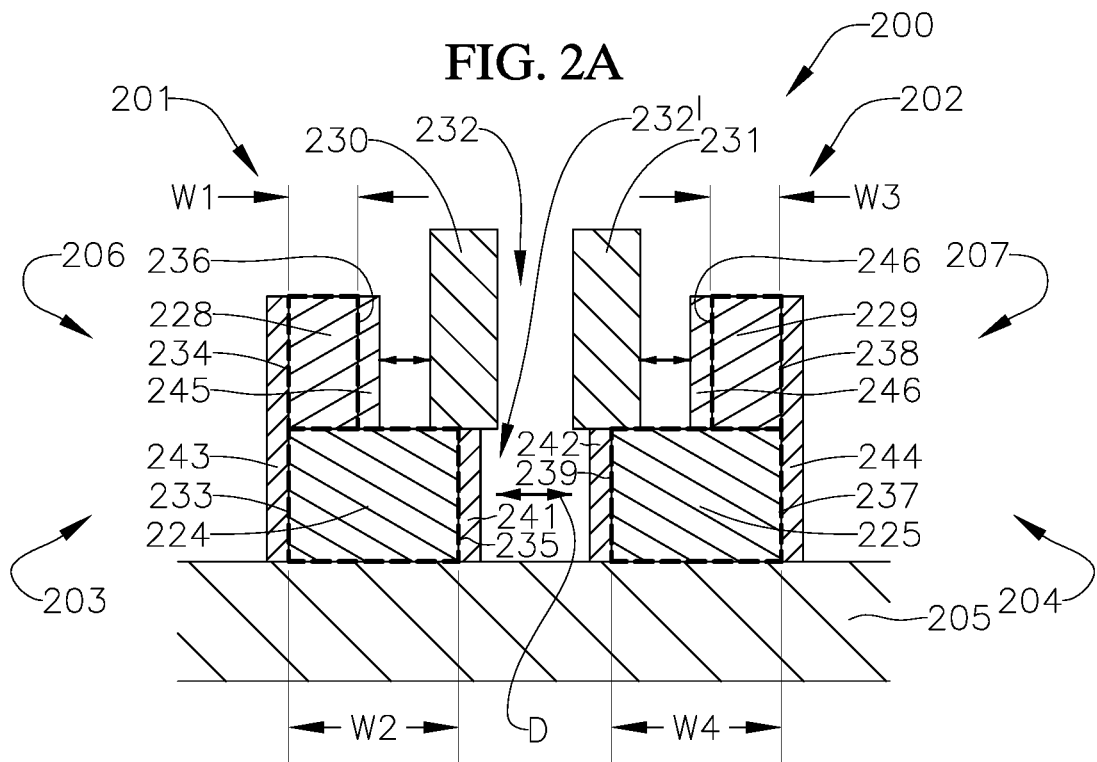
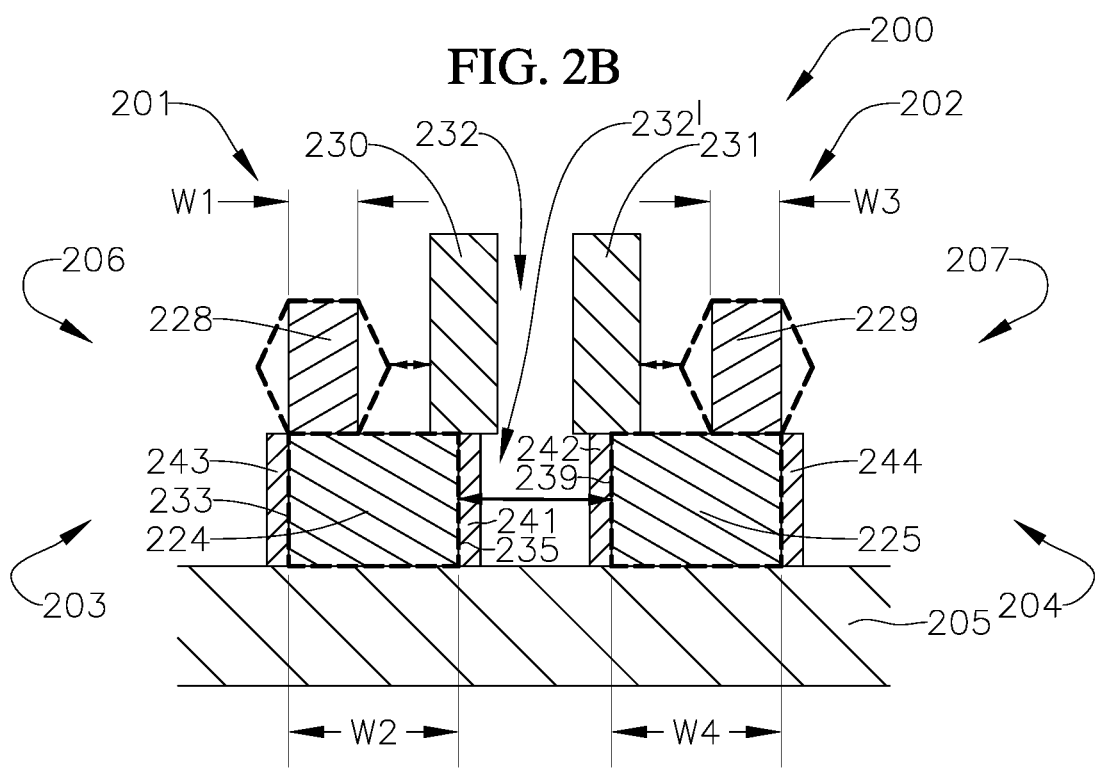

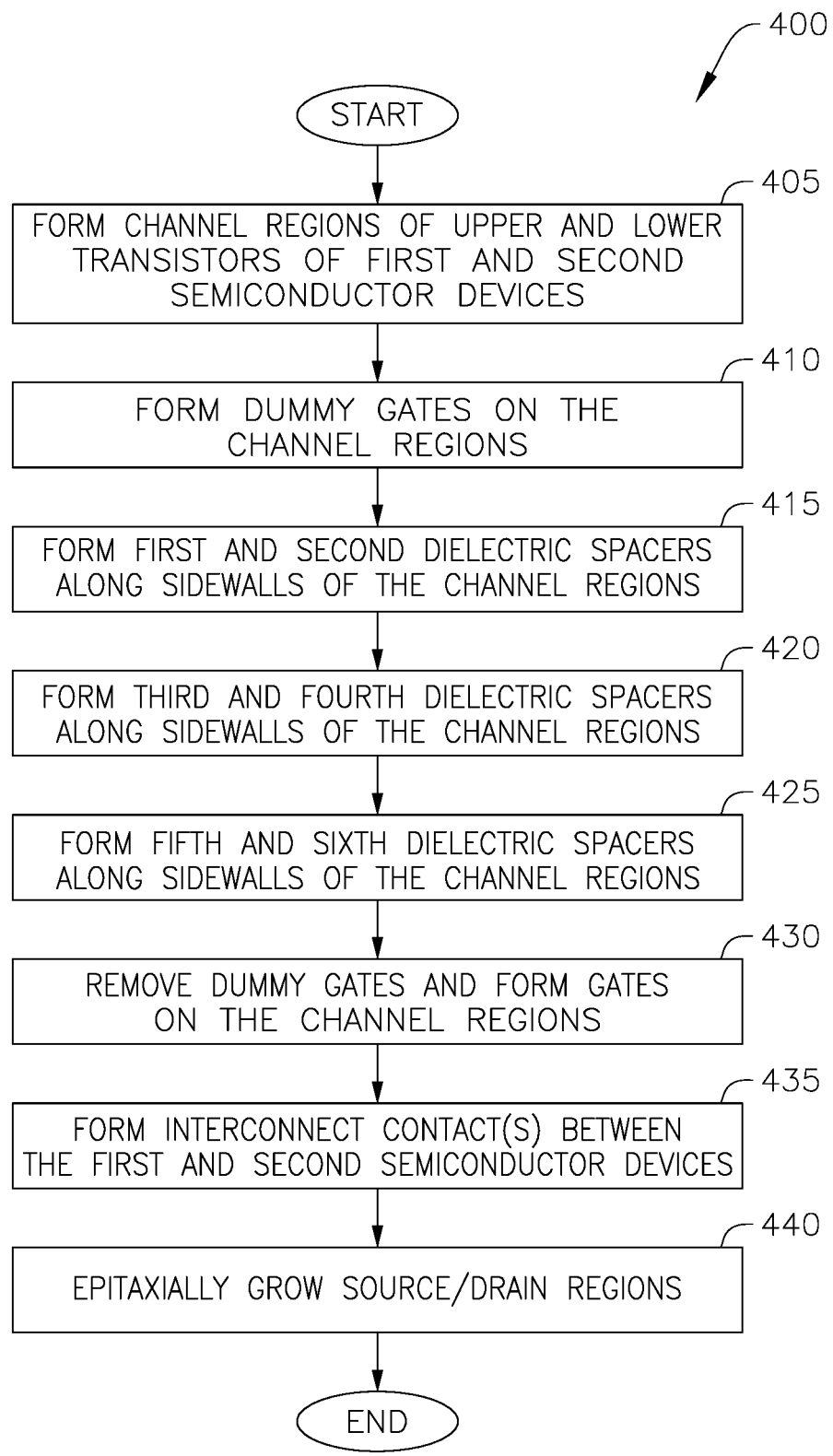

LIMITED LATERAL GROWTH OF S/D EPI BY OUTER DIELECTRIC LAYER IN 3-DIMENSIONAL STACKED DEVICE

CROSS-REFERENCE TO RELATED APPLICATION(S)

The present application claims priority to and the benefit of U.S. Provisional Application No. 63/332,206, filed Apr. 18, 2022, the entire content of which is incorporated herein by reference.

BACKGROUND

1. Field

The present disclosure relates to semiconductor cells and methods of manufacturing the same.

2. Description of the Related Art

The size of transistors has continued to decrease to sustain the scale down of the logic element in semiconductors. However, in the related art, the lateral epitaxial growth of the source and drain regions of the semiconductors during manufacturing limits the reduction in the spacing between adjacent semiconductor devices and/or between a semiconductor device and an adjacent interconnect contact, which limits the overall scale down in the size of the logic elements of the integrated circuit.

SUMMARY

The present disclosure relates to various embodiments of an integrated circuit and methods of manufacturing the same. In one embodiment, the integrated circuit includes a first semiconductor device and a second semiconductor device adjacent to the first semiconductor device. Each of the first and second semiconductor devices includes a lower transistor and an upper transistor on the lower transistor, and the upper and lower transistors each include a source region, a drain region, and a channel region extending between the source region and the drain region. The integrated circuit also includes a first dielectric spacer extending lengthwise along at least a portion of an inner sidewall of the channel region of the upper and/or lower transistor of the first semiconductor device, a second dielectric spacer facing the first dielectric spacer and extending lengthwise along at least a portion of an inner sidewall of the channel region of the upper and/or lower transistor of the second semiconductor device. The integrated circuit also includes an interconnect contact between the first semiconductor device and the second semiconductor device.

In one embodiment, a method of manufacturing an integrated circuit includes forming channel regions for a lower transistor and an upper transistor for each of a first semiconductor device and a second semiconductor device adjacent to the first semiconductor device. The method also includes depositing dummy gates on the channel regions, forming a first dielectric spacer extending lengthwise along at least a portion of an inner sidewall of the channel region of the upper and/or lower transistor of the first semiconductor device, and forming a second dielectric spacer facing the first dielectric spacer and extending lengthwise along at least a portion of an inner sidewall of the channel region of the upper and/or lower transistor of the second semiconductor device. The method also includes removing the dummy gates by selective etching, forming gates of the first and second semiconductor devices by conformally depositing a gate metal material on the channel regions, forming an interconnect contact between the first semiconductor device and the second semiconductor device, and epitaxially growing source and drain regions for the lower transistor and the upper transistor of each of the first semiconductor device and the second semiconductor device. The first dielectric spacer and the second dielectric spacer inhibit lateral growth of the source and drain regions during the epitaxially growing of the source and drain regions.

This summary is provided to introduce a selection of concepts that are further described below in the detailed description. This summary is not intended to identify key or essential features of the claimed subject matter, nor is it intended to be used in limiting the scope of the claimed subject matter. One or more of the described features or tasks may be combined with one or more other described features or tasks to provide a workable device or method, respectively.

BRIEF DESCRIPTION OF THE DRAWINGS

The features and advantages of embodiments of the present disclosure will be better understood by reference to the following detailed description when considered in conjunction with the accompanying figures. In the figures, like reference numerals are used throughout the figures to reference like features and components. The figures are not necessarily drawn to scale.

FIGS. 2A-2D depict various configurations of the integrated circuit of FIG. 2 according to various embodiments of the present disclosure;

FIG. 4 is a flowchart illustrating tasks of a method of manufacturing a semiconductor cell according to various embodiments of the present disclosure.

DETAILED DESCRIPTION

Figure 1:
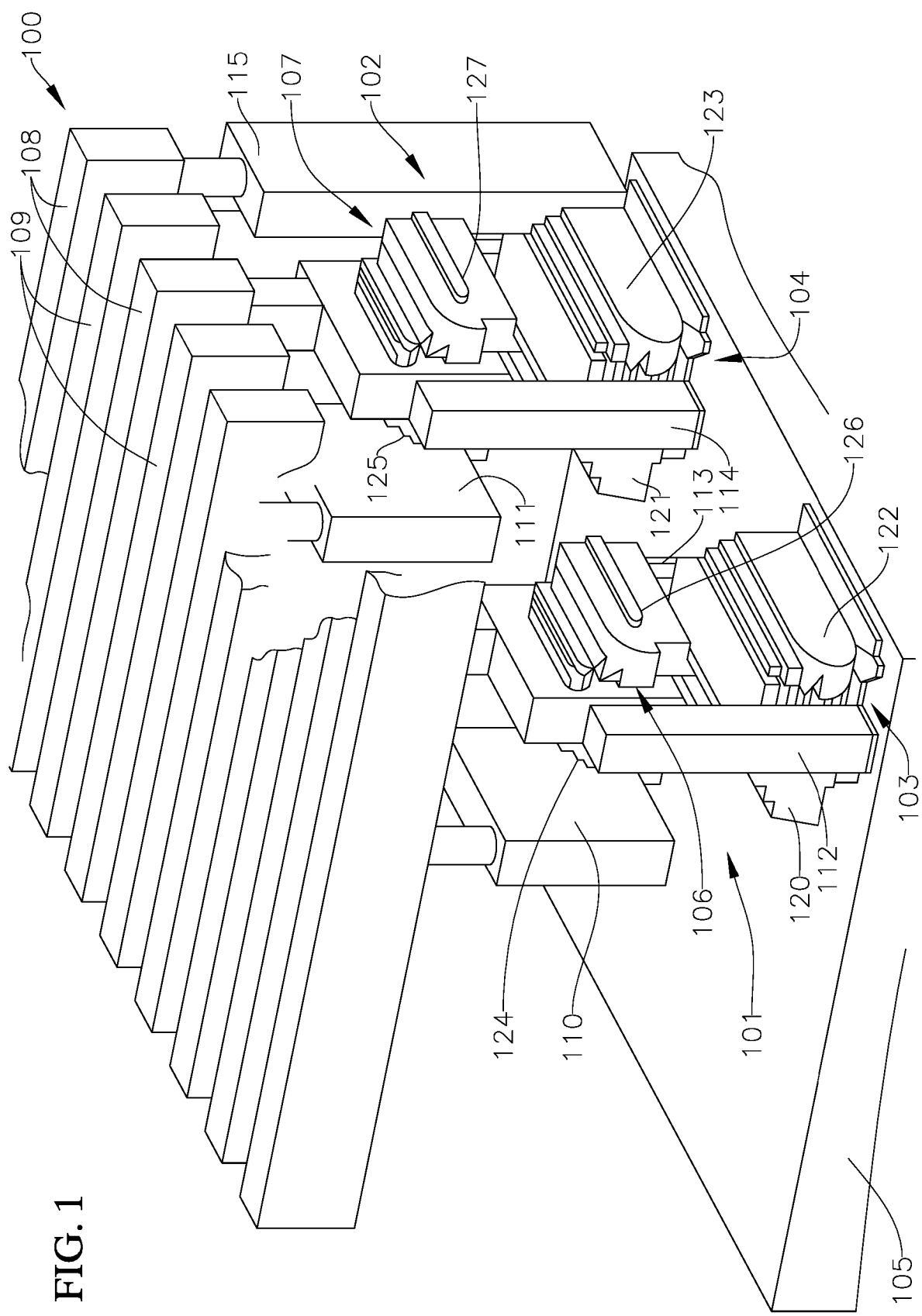
FIG. 1 is a perspective view of an integrated circuit according to one embodiment of the present disclosure including a stack of transistors having channels with the same width.

The present disclosure relates to various embodiments of semiconductor cells and methods of manufacturing the same. In one or more embodiments, the semiconductor cell includes two stacks of two transistors in each stack. Each stack may comprise an n-type field-effect transistor (n-FET) and a p-type field effect transistor (p-FET). In some embodiments, each stack comprises a CMOS pair of transistors. For instance, in one or more embodiments, the semiconductor cell includes a first semiconductor device including a stack of transistors (e.g., a first CMOS device including an n-FET stacked on a p-FET), and a second semiconductor device adjacent to the first semiconductor device also including a stack of transistors (e.g., a second CMOS device including an n-FET stacked on a p-FET). The semiconductor cell at least one interconnect contact between the semiconductor devices, and dielectric spacers on lateral sidewalls of the active channel regions of the first and second semiconductor devices. The dielectric spacers are configured to limit the lateral epitaxial growth of the source and drain regions of the semiconductor devices, which enables the semiconductor devices to be spaced closer to each other and/or closer to the interconnect contact without causing a short (i.e., the dielectric spacers enable the reduction in the spacing between the adjacent semiconductor devices and/or between the semiconductor devices and the interconnect contact that avoids a short). Reducing the size of the spacing between the adjacent semiconductor devices and/or between the semiconductor devices and the interconnect reduces the overall size of the semiconductor cells of the present disclosure compared to related art semiconductor cells without the dielectric spacers.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 depicts an integrated circuit 100 according to one embodiment of the present disclosure including a first semiconductor cell 101 adjacent to a second semiconductor cell 102. Each semiconductor cell 101 and 102 includes a CMOS device having a lower transistor 103, 104 (e.g., an n-type field-effect transistor (nFET)) on a substrate 105, and an upper transistor 106, 107 (e.g., a p-type field-effect transistor (pFET)) stacked on the lower transistor 103, 104, respectively. In one or more embodiments, the lower transistors 103, 104 may be pFETs and the upper transistors 106, 107 may be nFETs. Additionally, in one or more embodiments, each semiconductor cell 101 and 102 may include an isolation spacer between the upper transistor 106, 107 and the lower transistor 103, 104, respectively. The integrated circuit 100 also includes signal lines 108 and power lines 109 (i.e., a power distribution network (PDN) grid) above the upper transistors 106, 107 of the first and second semiconductor cells 101, 102. The power lines 109 are connected to the upper transistor 106 and the lower transistor 103 of the first semiconductor cell 101 by power contacts 110, and the power lines 109 are connected to the upper transistor 107 and the lower transistor 104 of the second semiconductor cell 102 by power contacts 111. Additionally, in the illustrated embodiment, the signal lines 108 are connected to the upper transistor 106 and the lower transistor 103 of the first semiconductor cell 101 by signal contacts 112 and a merged out contact 113, and the signal lines 108 are connected to the upper transistor 107 and the lower transistor 104 of the second semiconductor cell 102 by signal contacts 114 and a merged out contact 115.

The lower transistors 103, 104 of the first and second semiconductor cells 101 and 102, respectively, each include a source region 120, 121, a drain region 122, 123, and a channel region 124, 125 extending between the source region 120, 121, and the drain region 122, 123, respectively. Similarly, the upper transistors 106, 107 of the first and second semiconductor cells 101 and 102, respectively, each include a source region 124, 125, a drain region 126, 127, and a channel region 128, 129 extending between the source region 124, 125, and the drain region 126, 127, respectively.

FIGS. 1A-1D depict different configurations of the first and second semiconductor cells 101 and 102 according to various embodiments of the present disclosure. FIGS. 1A-1D are cross-sectional views taken along a lateral direction that is perpendicular (or substantially perpendicular) to a lengthwise direction extending from the source region 124, 125 to the respective drain region 126, 127. In the illustrated embodiments, the integrated circuit 100 includes an interconnect contact 130 in a gap 131 between the first and second semiconductor devices 101, 102. Additionally, in the embodiments illustrated in FIGS. 1A-1D, the widths W1 of the channel regions 128, 124 of the upper and lower transistors 103, 106 of the first semiconductor cell 101 are the same or substantially the same, and the widths W2 of the channel regions 129, 125 of the upper and lower transistors 107, 104 of the second semiconductor cell 102 are the same or substantially the same.

Additionally, in the illustrated embodiments, the integrated circuit 100 also includes a first dielectric spacer 132 extending along inner sidewalls 133, 134 of the active channel regions 124, 128 of the lower and upper transistors 103, 106, respectively, of the first semiconductor device 101, and a second dielectric spacer 135 extending along inner sidewalls 136, 137 of the active channel regions 125, 129 of the lower and upper transistors 104, 107, respectively, of the second semiconductor device 102. In the illustrated embodiment, the inner sidewalls 133, 134, 136, 137, and the first and second dielectric spacers 134, 135 thereon, face inward toward each other and toward the interconnect contact 130.

Figure 1A:
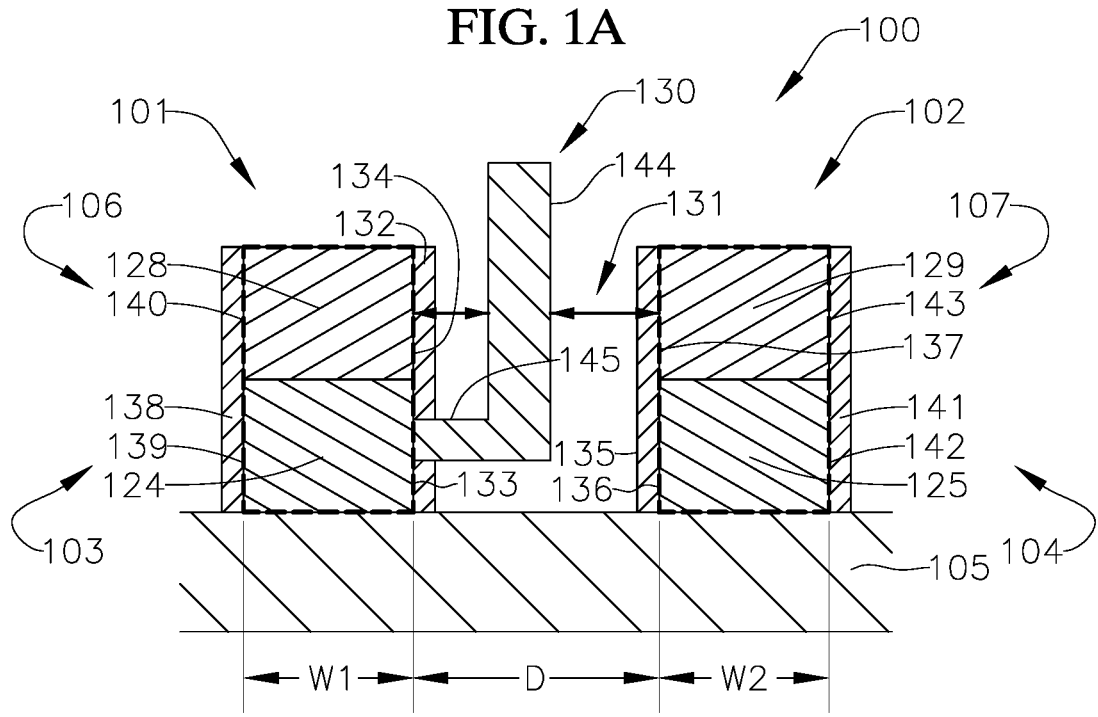
FIGS. 1A-1D depict various configurations of the integrated circuit of FIG. 1 according to various embodiments of the present disclosure.
Figure 1B:
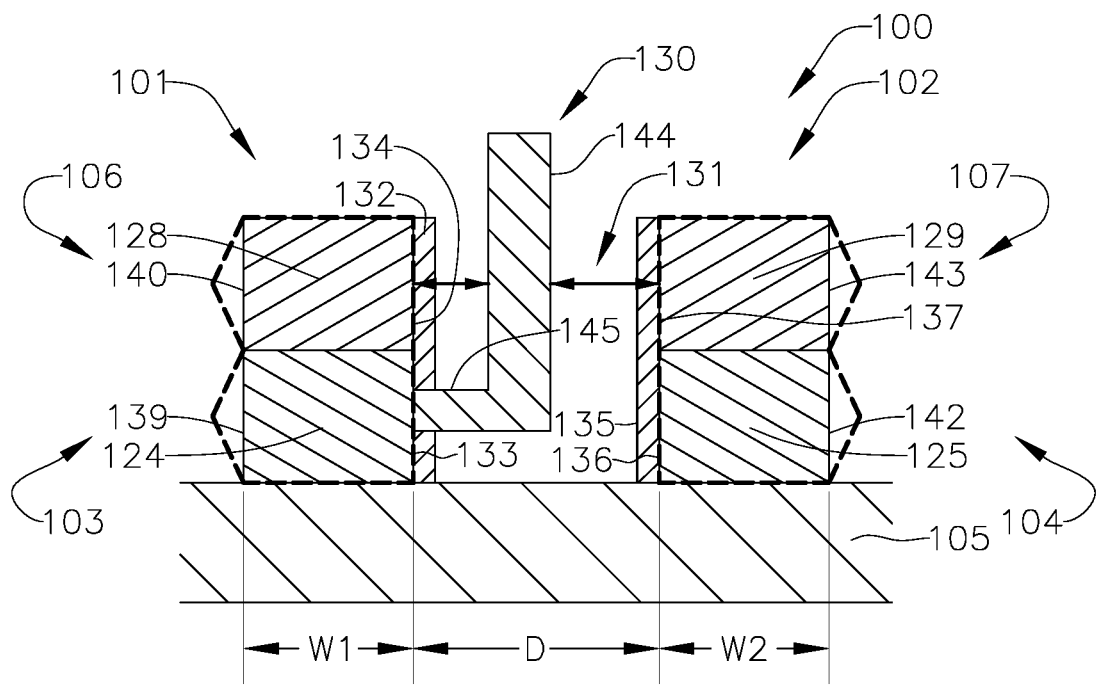
Figure 1C:
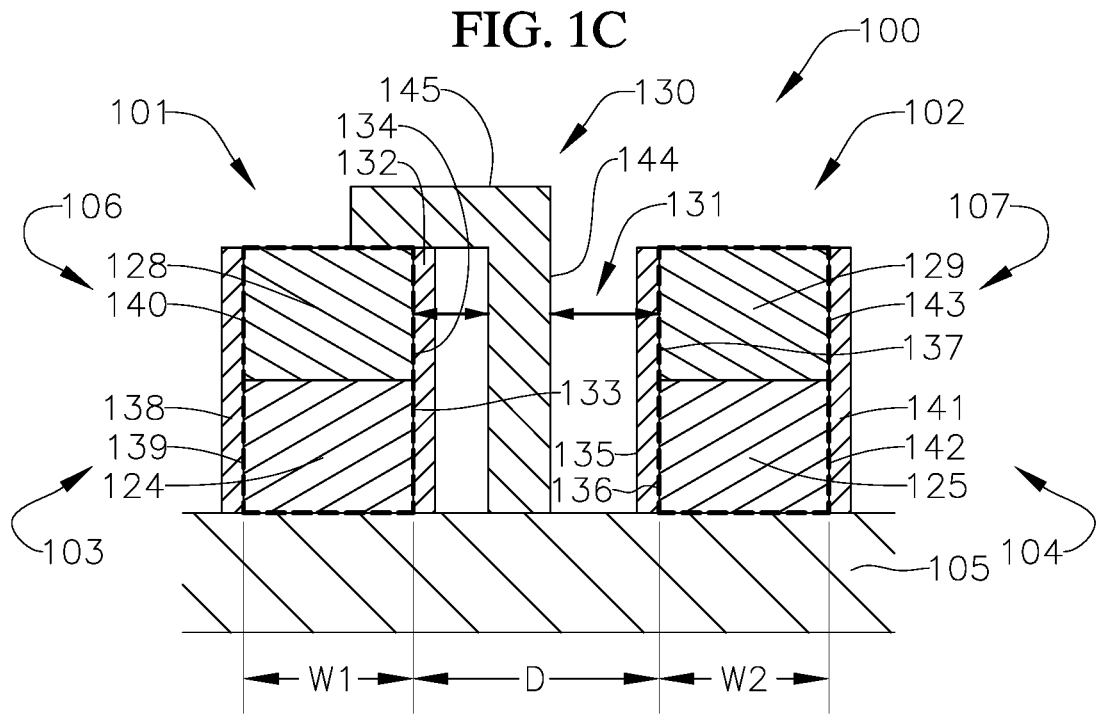

In the embodiments illustrated FIGS. 1A and 1C, the integrated circuit 100 also includes a third dielectric spacer 138 extending along outer sidewalls 139, 140 of the active channel regions 124, 128 of the lower and upper transistors 103, 106, respectively, of the first semiconductor device 101, and a fourth dielectric spacer 141 extending along outer sidewalls 142, 143 of the active channel regions 125, 129 of the lower and upper transistors 104, 107, respectively, of the second semiconductor device 102. In the illustrated embodiment, the outer sidewalls 139, 140, 142, 143, and the third and fourth dielectric spacers 138, 141 thereon, face outward away from each other.

The first and second dielectric spacers 132, 135 are configured to prevent the source/drain regions 120-127 from growing laterally inward toward each other. That is, the first dielectric spacer 132 is configured to prevent the source/drain regions 120-123 of the first semiconductor cell 101 from epitaxially growing inward toward the interconnection contact 130 and the second semiconductor cell 102; and the second dielectric spacer 135 is configured to prevent the source/drain regions 124-127 of the second semiconductor cell 102 from epitaxially growing inward toward the interconnection contact 135 and the first semiconductor cell 101. In this manner, the first and second dielectric spacers 132, 135 enable the reduction of the width D of the gap 131 between the first and second semiconductor cells 101, 102 that is required to prevent a short between the first and second semiconductor cells 101, 102 and the interconnect contact 130 (i.e., the distance D required to isolate the first and second semiconductor cells 101, 102 from each other, and to isolate each of the first and second semiconductor cells 101, 102 from the interconnect contact 130, may be reduced due to the presence of the first and second dielectric spacers 132, 135). The reduction of the width D of the gap 131 between the first and second semiconductor cells 101, 102 that is required for isolation enables the integrated circuit 100 to be smaller than related art integrated circuits without the dielectric spacers.

Additionally, in the embodiments illustrated in FIGS. 1A and 1C, the third and fourth dielectric spacers 138, 141 are configured to prevent the source/drain regions 120-127 from growing laterally outward away from each other. That is, the third dielectric layer 138 is configured to prevent the source/drain regions 120-123 of the first semiconductor cell 101 from epitaxially growing outward away from the interconnection contact 130 and away from the second semiconductor cell 102; and the fourth dielectric layer 141 is configured to prevent the source/drain regions 124-127 of the second semiconductor cell 102 from epitaxially growing outward away from the interconnection contact 130 and away from the first semiconductor cell 101. Together, the first, second, third, and fourth dielectric spacers 132, 135, 138, 141 are configured to confine lateral epitaxial growth of the source/drain regions 120-127. The dashed lines in FIGS. 1A and 1C represent the area in which the source/drain regions 120-127 are confined during epitaxial growth of the source/drain regions 120-127. Accordingly, because the lateral growth of the source/drain regions 120-127 is configured by the first, second, third, and fourth dielectric spacers 132, 135, 138, 141 in the illustrated embodiment, the source/drain regions 120-127 of the first and second semiconductor cells 101, 102 may the same or substantially the same lateral width as the active channel regions 124, 128, 125, 129 of the first and second semiconductor cells 101, 102.

Figure 1D:
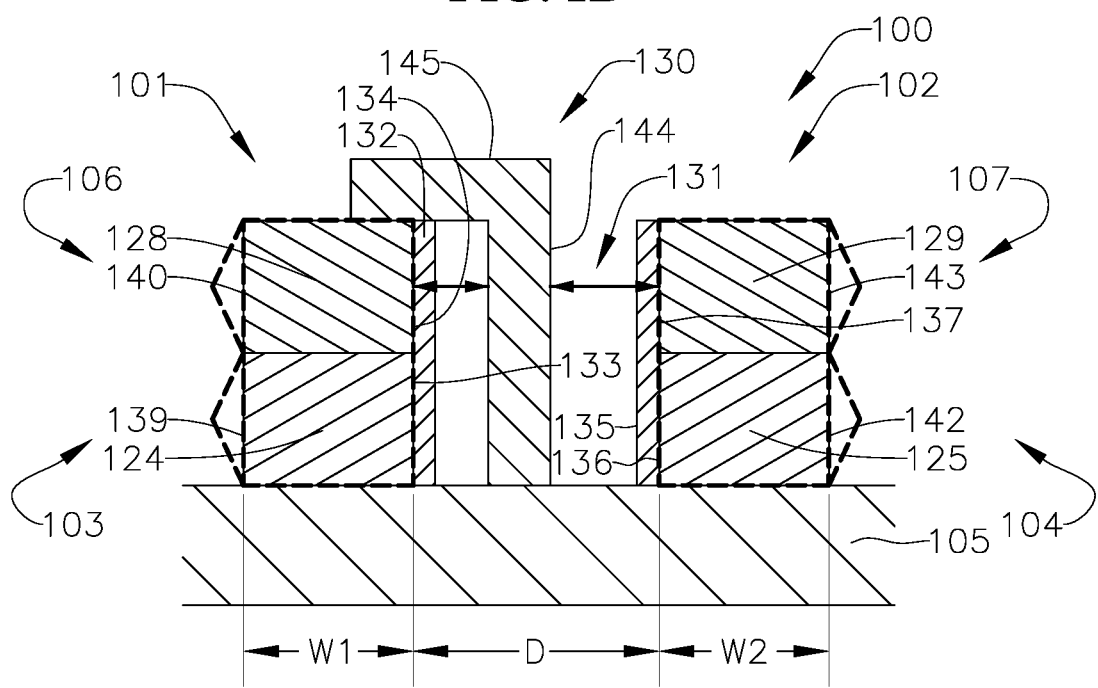

In one or more embodiments, the integrated circuit 100 may not include the third and fourth dielectric spacers 138, 141 on the outer sidewalls 139, 140, 142, 143 of the channel regions 124, 125, 128, 129. For instance, as illustrated in the embodiments depicted in FIGS. 1B and 1D, the integrated circuit 100 does not include the third and fourth dielectric spacers 138, 141 on the outer sidewalls 139, 140, 142, 143 of the channel regions 124, 125, 128, 129 (e.g., the integrated circuit 100 includes only the first and second dielectric spacers 132, 135 on the inner sidewalls 133, 134, 136, 137 of the active channel regions 124, 128, 125, 129). The dashed lines in FIGS. 1B and 1D represent the area in which the source/drain regions 120-127 are confined during epitaxial growth of the source/drain regions 120-127. Accordingly, in the embodiments depicted in FIGS. 1B and 1D, the first and second dielectric spacers 132, 135 on the inner sidewalls 133, 134, 136, 137 of the active channel regions 124, 128, 125, 129 prevent (or at least mitigate against) the source/drain regions 120-127 from growing laterally inward toward each other and toward the interconnect contact 130, but the absence of the third and fourth dielectric spacers 138, 141 permits the source/drain regions 120-127 to grow laterally outward away from each other.

In the illustrated embodiments, the interconnect contact 130 has an "L-shape" having a vertical segment 144 and a horizontal segment 145 extending from an end of the vertical segment 144. In the embodiments illustrated in FIGS. 1A-1B, the horizontal segment 145 of the interconnect contact 130 extends from a lower end of the vertical segment 144 and connects to the channel region 124 of the lower transistor 103 of the first semiconductor cell 101. In the embodiments illustrated in FIGS. 1C-1D, the horizontal segment 145 of the interconnect contact 130 extends from an upper end of the vertical segment 144 and connects to the channel region 128 of the upper transistor 106 of the first semiconductor cell 101. In one or more embodiments, the interconnect contact 130 may have any other suitable configuration.

Figure 2:
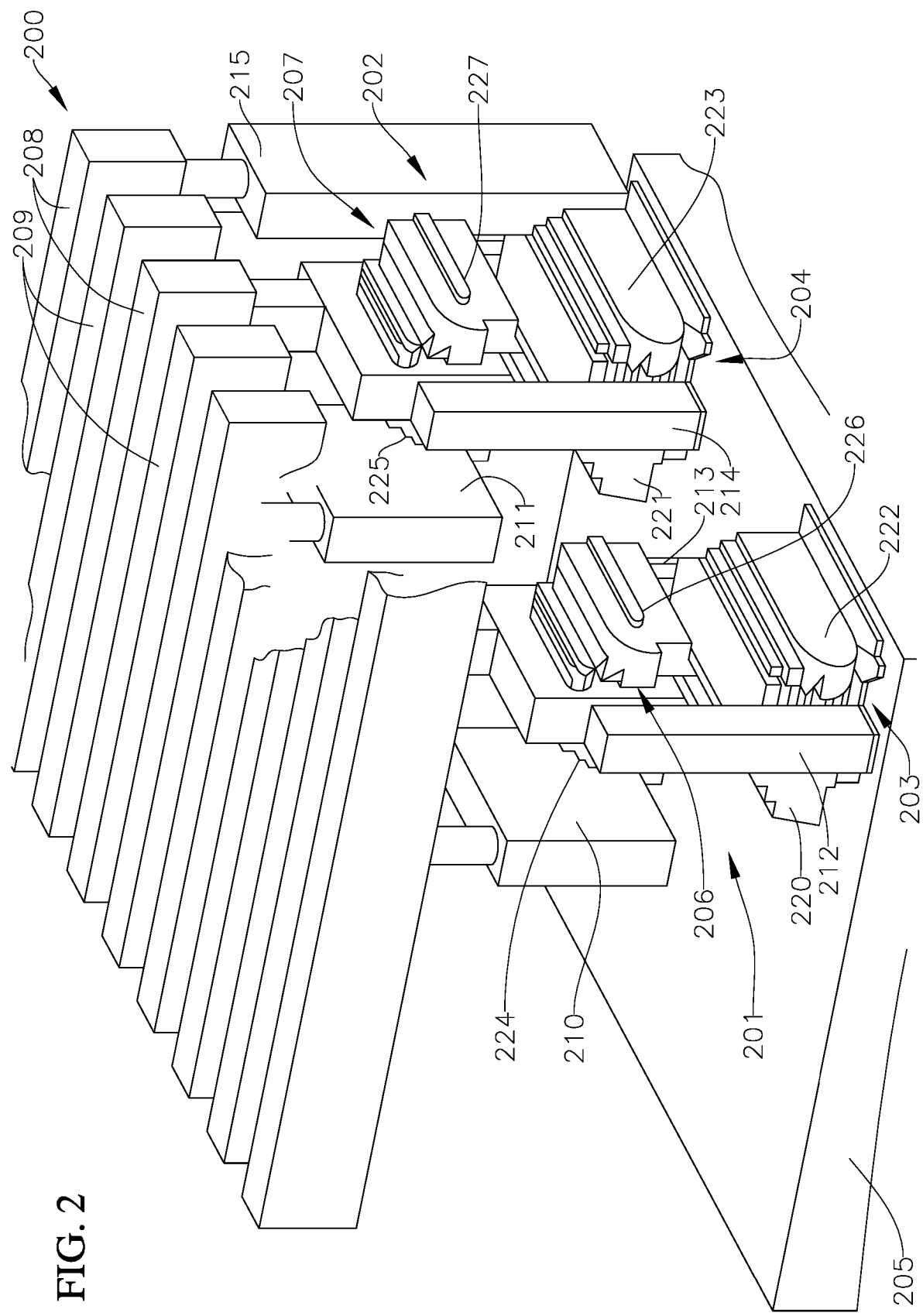
FIG. 2 is a perspective view of an integrated circuit according to another embodiment of the present disclosure including a stack of transistors having channels with the different widths.

FIG. 2 depicts an integrated circuit 200 according to another embodiment of the present disclosure including a first semiconductor cell 201 adjacent to a second semiconductor cell 202. Each semiconductor cell 201 and 202 includes a CMOS device having a lower transistor 203, 204 (e.g., an n-type field-effect transistor (nFET)) on a substrate 205, and an upper transistor 206, 207 (e.g., a p-type field-effect transistor (pFET)) stacked on the lower transistor 203, 204, respectively. In one or more embodiments, the lower transistors 203, 204 may be pFETs and the upper transistors 206, 207 may be nFETs. Additionally, in one or more embodiments, each semiconductor cell 201 and 202 may include an isolation spacer between the upper transistor 206, 207 and the lower transistor 203, 204, respectively. The integrated circuit 200 also includes signal lines 208 and power lines 209 (i.e., a power distribution network (PDN) grid) above the upper transistors 206, 207 of the first and second semiconductor cells 201, 202. The power lines 209 are connected to the upper transistor 206 and the lower transistor 203 of the first semiconductor cell 201 by power contacts 210, and the power lines 209 are connected to the upper transistor 207 and the lower transistor 204 of the second semiconductor cell 202 by power contacts 211. Additionally, in the illustrated embodiment, the signal lines 208 are connected to the upper transistor 206 and the lower transistor 203 of the first semiconductor cell 201 by signal contacts 212 and a merged out contact 213, and the signal lines 208 are connected to the upper transistor 207 and the lower transistor 204 of the second semiconductor cell 202 by signal contacts 214 and a merged out contact 215.

The lower transistors 203, 204 of the first and second semiconductor cells 201 and 202, respectively, each include a source region 220, 221, a drain region 222, 223, and a channel region 224, 225 extending between the source region 220, 221, and the drain region 222, 223, respectively. Similarly, the upper transistors 206, 207 of the first and second semiconductor cells 201 and 202, respectively, each include a source region 224, 225, a drain region 226, 227, and a channel region 228, 229 extending between the source region 224, 225, and the drain region 226, 227, respectively.

FIGS. 2A-2D depict different configurations of the first and second semiconductor cells 201 and 202 according to various embodiments of the present disclosure. FIGS. 2A-2D are cross-sectional views taken along a lateral direction that is perpendicular (or substantially perpendicular) to a lengthwise direction extending from the source region 220, 221 to the respective drain region 222, 223. In the illustrated embodiments, the integrated circuit 200 includes first and second interconnect contacts 230, 231 in a gap 232 between the upper transistors 206, 207 of the first and second semiconductor devices 201, 202.

Additionally, in the embodiments illustrated in FIGS. 2A-2D, the width W1 of the channel region 228 of the upper transistor 206 of the first semiconductor cell 201 is narrower than the width W2 of the channel region 224 of the lower transistor 203 of the first semiconductor cell 201, and the width W3 of the channel region 229 of the upper transistor 207 of the first semiconductor cell 201 is narrower than the width W4 of the channel region 225 of the lower transistor 204 of the first semiconductor cell 201. In the illustrated embodiments, outer sidewalls 233, 234 of the channel regions 224, 228, respectively, of the first semiconductor cell 201 are aligned or substantially aligned, and inner sidewalls 235, 236 of the channel regions 224, 228, respectively, of the first semiconductor cell 201 are offset relative to each other. In the illustrated embodiments, the inner sidewall 236 of the channel region 228 of the upper transistor 206 of the first semiconductor cell 201 is offset outward relative to the inner sidewall 235 of the channel region 224 of the lower transistor 203 of the first semiconductor cell 201. Similarly, in the illustrated embodiments, outer sidewalls 237, 238 of the channel regions 225, 229 of the lower and upper transistors 204, 207, respectively, of the second semiconductor cell 202 are aligned or substantially aligned, and inner sidewalls 239, 240 of the channel regions 225, 229 of the lower and upper transistors 204, 207, respectively, of the second semiconductor cell 202 are offset relative to each other. In the illustrated embodiments, the inner sidewall 240 of the channel region 229 of the upper transistor 207 of the second semiconductor cell 202 is offset outward relative to the inner sidewall 239 of the channel region 225 of the lower transistor 204 of the second semiconductor cell 202.

In the embodiment illustrated in FIG. 2A, the integrated circuit 200 also includes a first dielectric spacer 241 extending along the inner sidewall 235 of the active channel region 224 of the lower transistor 203 (e.g., the nFET) of the first semiconductor cell 201, and a second dielectric spacer 242 extending along the inner sidewall 239 of the active channel region 225 of the lower transistor 204 (e.g., the nFET) of the second semiconductor cell 202. In the illustrated embodiment, the inner sidewalls 235, 239, and the first and second dielectric spacers 241, 242 thereon, face inward toward each other.

In the embodiment illustrated in FIG. 2A, the integrated circuit 200 also includes a third dielectric spacer 243 extending along the outer sidewalls 233, 234 of the active channel regions 224, 228 of the lower and upper transistors 203, 206 of the first semiconductor cell 201, and a fourth dielectric spacer 244 extending along the outer sidewalls 237, 238 of the active channel regions 225, 229 of the lower and upper transistors 204, 207 of the second semiconductor cell 202. In the illustrated embodiment, the outer sidewalls 233, 234, 237, 238, and the third and fourth dielectric spacers 243, 244 thereon, face outward away from each other.

With continued reference to the embodiment illustrated in FIG. 2A, the integrated circuit 200 also includes a fifth dielectric spacer 245 extending along the inner sidewall 236 of the active channel region 228 of the upper transistor 206 (e.g., the pFET) of the first semiconductor cell 201, and a sixth dielectric spacer 246 extending along the inner sidewall 240 of the active channel region 229 of the upper transistor 207 (e.g., the pFET) of the second semiconductor cell 202. In the illustrated embodiment, the inner sidewalls 236, 240, and the fifth and sixth dielectric spacers 245, 246 thereon, face inward toward each other.

The first, second, fifth, and sixth dielectric spacers 241, 242, 245, 246 are configured to prevent the source/drain regions 220-227 from growing laterally inward toward each other. That is, the first dielectric spacer 241 is configured to prevent the source/drain regions 220-223 of the first semiconductor cell 201 from epitaxially growing inward toward the second semiconductor cell 202; the second dielectric spacer 242 is configured to prevent the source/drain regions 224-227 of the second semiconductor cell 202 from epitaxially growing inward toward the first semiconductor cell 201; the fifth dielectric spacer 245 is configured to prevent the source/drain regions 220-223 of the first semiconductor cell 201 from epitaxially growing inward toward the first interconnect contact 230; and the sixth dielectric spacer 246 is configured to prevent the source/drain regions 224-227 of the second semiconductor cell 202 from epitaxially growing inward toward the second interconnect contact 231. In this manner, the first and second dielectric spacers 241, 242 enable the reduction of the width of the gap 232' between the lower transistors 203, 204 of the first and second semiconductor cells 201, 202 that is required to prevent a short between the first and second semiconductor cells 201, 202, and the reduction of the width of the gap 232" between the upper transistors 206, 207 of the first and second semiconductor cells 201, 202 that is required to prevent a short between the first and second semiconductor cells 201, 202 and the first and second interconnect contacts 230, 231 (i.e., the distance required to isolate the first and second semiconductor cells 201, 202 from each other, and to isolate each of the first and second semiconductor cells 201, 202 from the interconnect contacts 230, 231, may be reduced due to the presence of the first, second, fifth, and sixth dielectric spacers 241, 242, 245, 246). The reduction of the widths of the gaps 232', 232" between the first and second semiconductor cells 201, 202 that is required for isolation enables the integrated circuit 200 to be smaller than related art semiconductor cells without the dielectric spacers.

In one or more embodiments, the integrated circuit 200 may not include all of the dielectric spacers 241-246 described above with reference to the embodiment illustrated in FIG. 2A. For instance, in the embodiment depicted in FIG. 2B, the integrated circuit 200 does not include the fifth and sixth dielectric spacers 245, 246 on the inner sidewalls 236, 240 of the upper transistors 206, 207 of the first and second semiconductor cells 201, 202, and the third and fourth dielectric spacers 243, 244 do not extend along the outer sidewalls 234, 238 of channel regions 228, 229 of the upper transistors 206, 207 of the first and second cells 201, 202 (i.e., the third and fourth dielectric spacers 243, 244 extend only along the outer sidewalls 233, 237 of the channel regions 224, 225 of the lower transistors 203, 204 of the first and second semiconductor cells 201, 202). The dashed lines in FIG. 2B represent the area in which the source/drain regions 220-227 are confined during epitaxial growth of the source/drain regions 220-227. Accordingly, in the embodiments depicted in FIG. 2B, the first and second dielectric spacers 241, 242 on the inner sidewalls 235, 239 of the active channel regions 224, 225 of the lower transistors 203, 204 prevent (or at least mitigate against) the source/drain regions 220-223 of the lower transistors 203, 204 from growing laterally inward toward each other, but the absence of the third and fourth dielectric spacers 243, 244 on the outer sidewalls 234, 238 of the channel regions 228, 229 of the upper transistors 206, 207 and the absence of the fifth and sixth dielectric spacers 245, 246 on the inner sidewalls 236, 240 of the channel regions 228, 229 of the upper transistors 206, 207 permits the source/drain regions 224-227 of the upper transistors 206, 207 to grow laterally inward toward the interconnect contacts 230, 231 and outward away from each other.

Figure 2C:
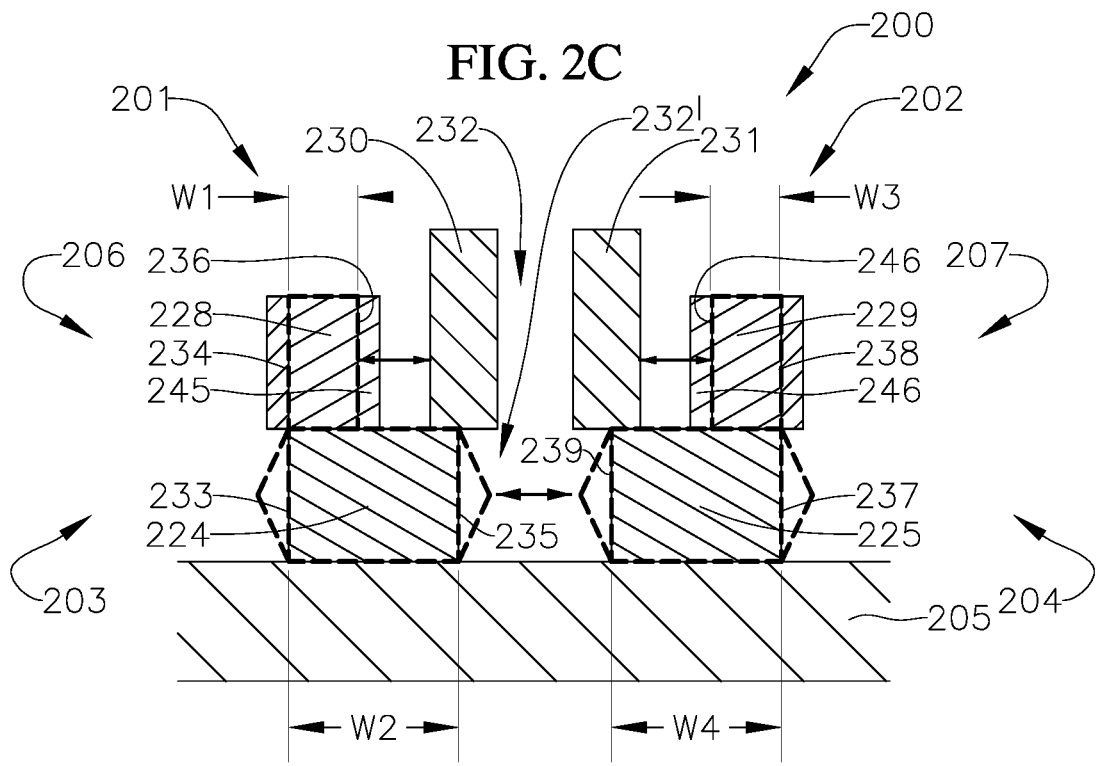

In the embodiment depicted in FIG. 2C, the integrated circuit 200 does not include the first and second dielectric spacers 241, 242 on the inner sidewalls 235, 239 of the channel regions 224, 225 of the lower transistors 203, 204 of the first and second semiconductor devices 201 and 202, and the third and fourth dielectric spacers 243, 244 do not extend along the outer sidewalls 233, 237 of the lower transistors 203, 204 of the first and second semiconductors 201 and 202 (i.e., the third and fourth dielectric spacers 243, 244 extend only along the outer sidewalls 234, 238 of the upper transistors 206, 207 of the first and second semiconductors 201 and 202). The dashed lines in FIG. 2C represent the area in which the source/drain regions 220-223 are confined during epitaxial growth of the source/drain regions 220-227. Accordingly, in the embodiments depicted in FIG. 2C, the fifth and sixth dielectric spacers 245, 246 on the inner sidewalls 236, 240 of the active channel regions 228, 229 of the upper transistors 206, 207 prevent (or at least mitigate against) the source/drain regions 224-227 of the upper transistors 206, 207 from growing laterally inward toward each other and toward the interconnect contacts 230, 231, but the absence of the third and fourth dielectric spacers 243, 244 on the channel regions 224, 225 of the lower transistors 203, 204 and the absence of the first and second dielectric spacers 241, 242 permits the source/drain regions 220-223 of the lower transistors 203, 204 to grow laterally inward toward each other and outward away from each other.

Figure 2D:
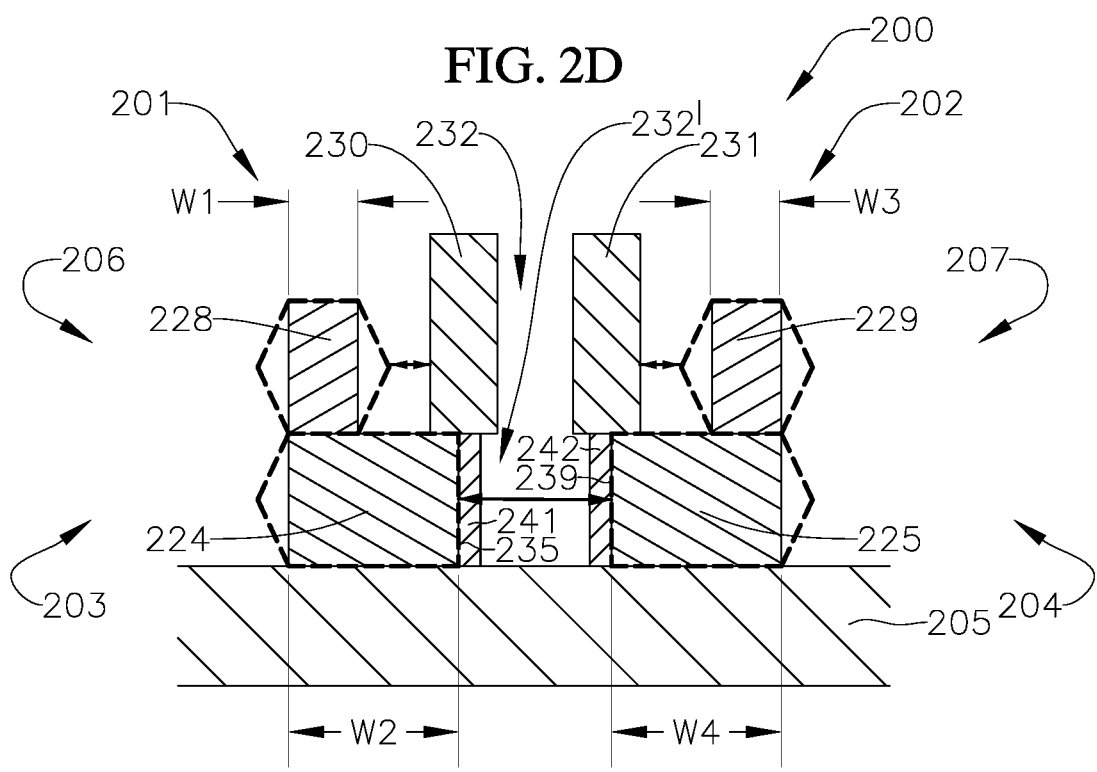

In the embodiment depicted in FIG. 2D, the integrated circuit 200 does not include the first and second dielectric spacers 241, 242 or the fifth and sixth dielectric spacers 245, 246 (i.e., dielectric spacers of the integrated circuit 200 include only the first and second dielectric spacers 241, 242 on the inner sidewalls of the channel regions 224, 225 of the lower transistors 203, 204). The dashed lines in FIG. 2D represent the area in which the source/drain regions 220-227 are confined during epitaxial growth of the source/drain regions 220-227. Accordingly, in the embodiments depicted in FIG. 2D, the first and second dielectric spacers 241, 242 on the inner sidewalls 235, 239 of the active channel regions 224, 225 of the lower transistors 203, 204 prevent (or at least mitigate against) the source/drain regions 220-223 of the lower transistors 203, 204 from growing laterally inward toward each other, but the absence of the third, fourth, fifth, and sixth dielectric spacers 243, 244, 245, 246 permits the source/drain regions 224-227 of the upper transistors 206, 207 to grow laterally inward toward each other and the interconnect contacts 230, 231 and outward away from each other, and permits the source/drain regions 220-223 of the lower transistors 203, 204 to grow laterally outward away from each other.

In one or more embodiments, the dielectric spacers of the integrated circuit 200 include only the first dielectric spacer 241 extending along the inner sidewall 235 of the active channel region 224 of the lower transistor 203 of the first semiconductor cell 201, the second dielectric spacer 242 extending along the inner sidewall 239 of the active channel region 225 of the lower transistor 204 of the second semiconductor cell 202, the fifth dielectric spacer 245 extending along the inner sidewall 236 of the active channel region 228 of the upper transistor 206 of the first semiconductor cell 201, and the sixth dielectric spacer 246 extending along the inner sidewall 240 of the active channel region 229 of the upper transistor 207 of the second semiconductor cell 202 (i.e., the integrated circuit 200 includes dielectric spacers only on the inner sidewalls 235, 236, 239, 240 of the channel regions 224, 225, 228, 229 of the upper and lower transistors 203, 204, 206, 207).

Figure 3:
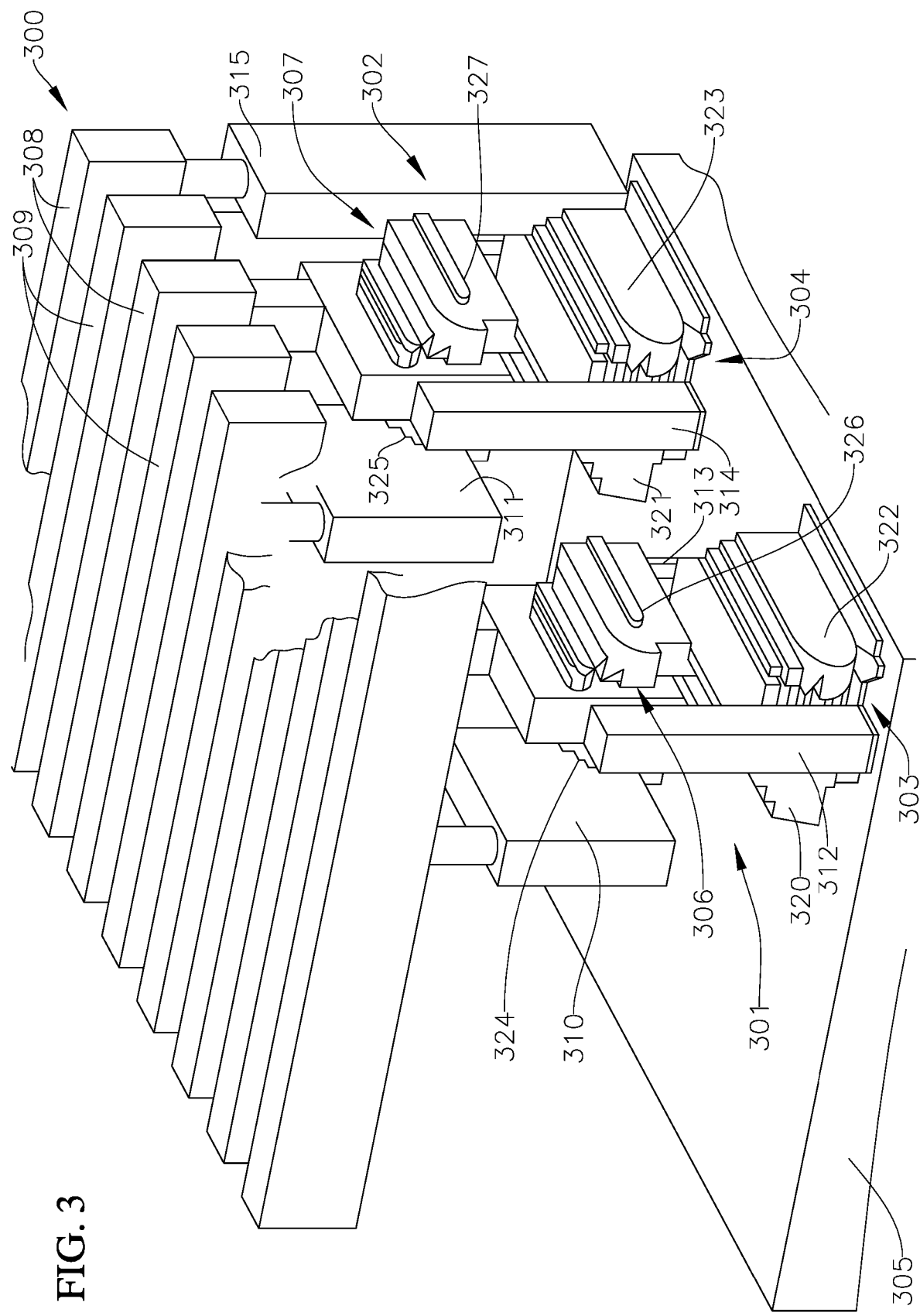
FIG. 3 is a perspective view of an integrated circuit according to a further embodiment of the present disclosure including a stack of transistors having channels with the different widths.

FIG. 3 depicts an integrated circuit 300 according to one embodiment of the present disclosure including a first semiconductor cell 301 adjacent to a second semiconductor cell 302. Each semiconductor cell 301 and 302 includes a CMOS device having a lower transistor 303, 304 (e.g., an n-type field-effect transistor (nFET)) on a substrate 305, and an upper transistor 306, 307 (e.g., a p-type field-effect transistor (pFET)) stacked on the lower transistor 303, 304, respectively. In one or more embodiments, the lower transistors 303, 304 may be pFETs and the upper transistors 306, 307 may be nFETs. Additionally, in one or more embodiments, each semiconductor cell 301 and 302 may include an isolation spacer between the upper transistor 306, 307 and the lower transistor 303, 304, respectively. The integrated circuit 300 also includes signal lines 308 and power lines 309 (i.e., a power distribution network (PDN) grid) above the upper transistors 306, 307 of the first and second semiconductor cells 301, 302. The power lines 309 are connected to the upper transistor 306 and the lower transistor 303 of the first semiconductor cell 301 by power contacts 310, and the power lines 309 are connected to the upper transistor 307 and the lower transistor 304 of the second semiconductor cell 302 by power contacts 311. Additionally, in the illustrated embodiment, the signal lines 308 are connected to the upper transistor 306 and the lower transistor 303 of the first semiconductor cell 301 by signal contacts 312 and a merged out contact 313, and the signal lines 308 are connected to the upper transistor 307 and the lower transistor 304 of the second semiconductor cell 302 by signal contacts 314 and a merged out contact 315.

The lower transistors 303, 304 of the first and second semiconductor cells 301 and 302, respectively, each include a source region 320, 321, a drain region 322, 323, and a channel region 324, 325 extending between the source region 320, 321, and the drain region 322, 323, respectively. Similarly, the upper transistors 306, 307 of the first and second semiconductor cells 301 and 302, respectively, each include a source region 324, 325, a drain region 326, 327, and a channel region 328, 329 extending between the source region 324, 325, and the drain region 326, 327, respectively.

FIGS. 3A-3D depict different configurations of the first and second semiconductor cells 301 and 302 according to various embodiments of the present disclosure. FIGS. 3A-3D are cross-sectional views taken along a lateral direction that is perpendicular (or substantially perpendicular) to a lengthwise direction extending from the source region 320, 321 to the respective drain region 322, 323. In the illustrated embodiments, the integrated circuit 300 includes an interconnect contact 330 in a gap 331 between the first and second semiconductor devices 301, 302. Additionally, in the embodiments illustrated in FIGS. 3A-3D, for each of the first and second semiconductor devices 301, 302, the width W1 of the channel region 328, 329 of the upper transistor 306, 307 is narrower than the width W2 of the channel region 324, 325 of the lower transistor 304, 305. In the illustrated embodiments, inner sidewalls 332, 333 of the channel regions 324, 328 of the lower and upper transistors 304, 306, respectively, of the first semiconductor cell 301 are aligned or substantially aligned, and outer sidewalls 334, 335 of the channel regions 324, 328 of the lower and upper transistors 304, 306, respectively, of the first semiconductor cell 301 are offset relative to each other. In the illustrated embodiments, the outer sidewall 334 of the channel region 324 of the lower transistor 304 of the first semiconductor cell 301 is offset outward relative to the outer sidewall 335 of the channel region 328 of the upper transistor 306 of the first semiconductor cell 301. Similarly, in the illustrated embodiments, inner sidewalls 336, 337 of the channel regions 325, 329 of the lower and upper transistors 305, 307, respectively, of the second semiconductor cell 302 are aligned or substantially aligned, and outer sidewalls 338, 339 of the channel regions 325, 329 of the lower and upper transistors 305, 306, respectively, of the second semiconductor cell 302 are offset relative to each other. In the illustrated embodiments, the outer sidewall 338 of the channel region 325 of the lower transistor 305 of the second semiconductor cell 302 is offset outward relative to the outer sidewall 339 of the channel region 329 of the upper transistor 307 of the second semiconductor cell 302.

Figure 3A:
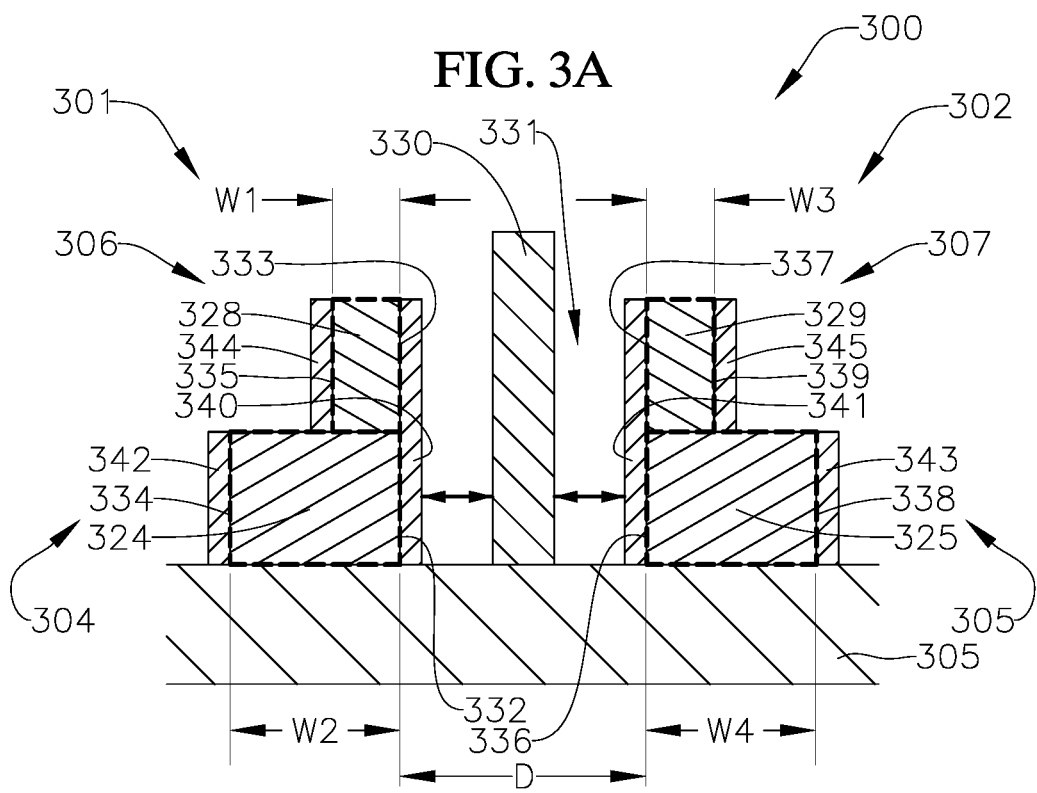
FIGS. 3A-3D depict various configurations of the integrated circuit of FIG. 3 according to various embodiments of the present disclosure.

In the embodiment illustrated in FIG. 3A, the integrated circuit 300 also includes a first dielectric spacer 340 extending along the inner sidewalls 332, 333 of the active channel regions 324, 328 of the lower transistor 304 (e.g., the nFET) and the upper transistor 306 (e.g., the pFET) of the first semiconductor device 301, and a second dielectric spacer 341 extending along the inner sidewalls 336, 337 of the active channel regions 325, 329 of the lower transistor 305 (e.g., the nFET) and the upper transistor 307 (e.g., the pFET) of the second semiconductor device 302. In the illustrated embodiment, the inner sidewalls 332, 333, 336, 337, and the first and second dielectric spacers 340, 341 thereon, face inward toward each other.

In the embodiment illustrated in FIG. 3A, the integrated circuit 300 also includes a third dielectric spacer 342 extending along the outer sidewall 334 of the active channel region 324 of the lower transistor 304 of the first semiconductor device 301, and a fourth dielectric spacer 343 extending along the outer sidewall 338 of the active channel region 325 of the lower transistor 305 of the second semiconductor device 302. In the illustrated embodiment, the outer sidewalls 334, 338, and the third and fourth dielectric spacers 342, 343 thereon, face outward away from each other.

With continued reference to the embodiment illustrated in FIG. 3A, the integrated circuit 300 also includes a fifth dielectric spacer 344 extending along the outer sidewall 335 of the active channel region 328 of the upper transistor 306 (e.g., the pFET) of the first semiconductor device 301, and a sixth dielectric spacer 345 extending along the outer sidewall 339 of the active channel region 329 of the upper transistor 302 (e.g., the pFET) of the second semiconductor device 302. In the illustrated embodiment, the outer sidewalls 335, 339, and the fifth and sixth dielectric spacers 344, 345 thereon, face outward away from each other.

The first and second dielectric spacers 340, 341 are configured to prevent the source/drain regions from growing laterally inward toward each other. That is, the first dielectric spacer 340 is configured to prevent the source/drain regions of the first semiconductor device 301 from epitaxially growing inward toward the second semiconductor device 302 and toward the interconnect contact 330; and the second dielectric spacer 341 is configured to prevent the source/drain regions of the second semiconductor device 302 from epitaxially growing inward toward the first semiconductor device 301 and toward the interconnect contact 330. In this manner, the first and second dielectric spacers 340, 341 enable the reduction of the width W of the gap 331 between the corresponding upper and lower transistors of the first and second semiconductor devices 301, 302 that is required to prevent a short between the first and second semiconductor devices 301, 302 and the interconnect contact 330 (i.e., the distance required to isolate the first and second semiconductor devices 301, 302 from the interconnect contact 330 may be reduced due to the presence of the first and second dielectric spacers 340, 341). The reduction of the width D of the gap 331 between the first and second semiconductor devices 301, 302 that is required for isolation enables the integrated circuit 300 to be smaller than related art semiconductor cells without the dielectric spacers.

Figure 3B:
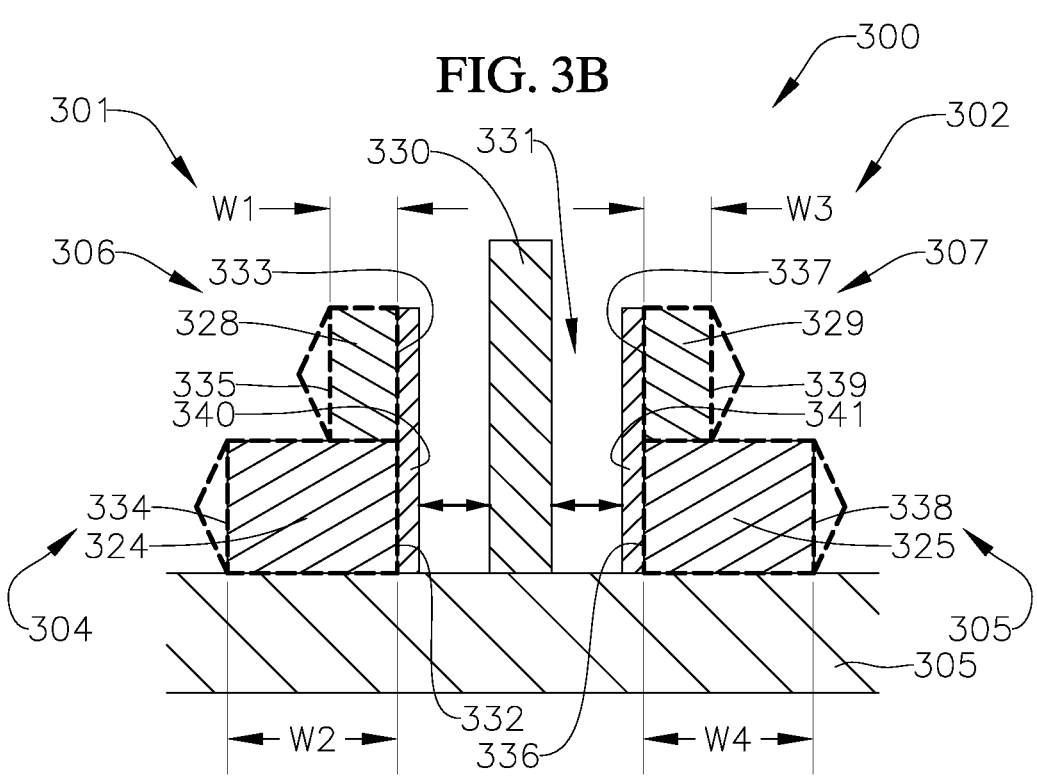

In one or more embodiments, the integrated circuit 300 may not include all of the dielectric spacers described above with reference to the embodiment illustrated in FIG. 3A. For instance, in the embodiment depicted in FIG. 3B, the integrated circuit 300 does not include the third and fourth dielectric spacers 342, 343 on the outer sidewalls 334, 338 of the channel regions 324, 325 of the lower transistors 304, 305 of the first and second semiconductor devices 301, 302, or the fifth and sixth dielectric spacers 344, 345 on the outer sidewalls 335, 339 of the channel regions 328, 329 of the upper transistors 306, 307 of the first and second semiconductors 301, 302 (i.e., the dielectric layers of the integrated circuit 300 include only the first and second dielectric spacers 340, 341 that extend along the inner sidewalls 332, 333, 336, 337 of the channel regions 324, 325, 328, 329 of the upper and lower transistors 304, 306, 305, 307 of the first and second semiconductor devices 301, 302). The dashed lines in FIG. 3B represent the area in which the source/drain regions are confined during epitaxial growth of the source/drain regions. In the embodiments depicted in FIG. 3B, the first and second dielectric spacers 340, 341 on the inner sidewalls 332, 333, 336, 337 of the channel regions 324, 325, 328, 329 prevent (or at least mitigate against) the source/drain regions of the upper and lower transistors 304, 305, 306, 307 from growing laterally inward toward each other and towards the interconnect contact 330, but the absence of the third and fourth dielectric spacers 342, 343 on the outer sidewalls 334, 338 of the channel regions 324, 325 of the lower transistors 304, 305 and the absence of the fifth and sixth dielectric spacers 344, 345 on the outer sidewalls 335, 339 of the channel regions 328, 329 of the upper transistors 306, 307 permits the source/drain regions of the upper and lower transistors 304, 305, 306, 307 to grow laterally outward away from each other.

Figure 3C:
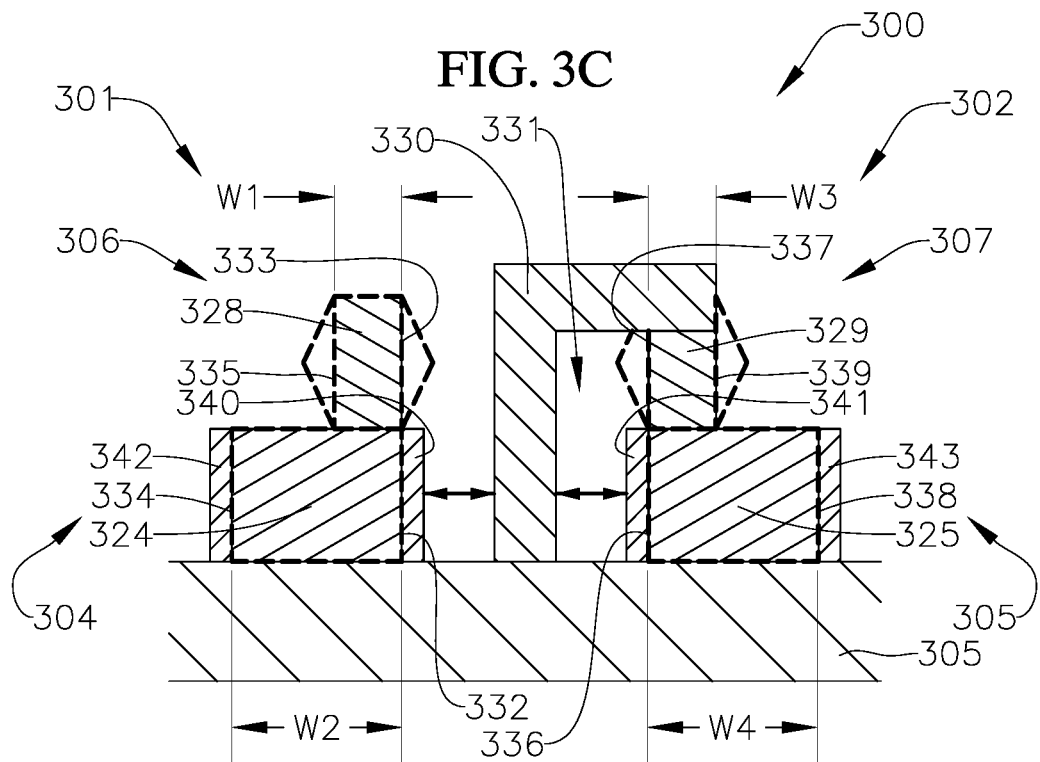

In the embodiment depicted in FIG. 3C, the integrated circuit 300 does not include the fifth and sixth dielectric spacers 344, 345 on the outer sidewalls 335, 339 of the channel regions 328, 329 of the upper transistors 306, 307 of the first and second semiconductors 301, 302, and the first and second dielectric spacers 340, 341 do not extend along the inner sidewalls 333, 337 of the channel regions 328, 329 of the upper transistors 306, 307 of the first and second semiconductors 301, 302 (i.e., the first and second dielectric spacers 340, 341 extend only along the inner sidewalls 332, 336 of the channel regions 324, 325 of the lower transistors 304, 305 of the first and second semiconductors 301, 302). The dashed lines in FIG. 3C represent the area in which the source/drain regions are confined during epitaxial growth of the source/drain regions. In the embodiment depicted in FIG. 3C, the first and second dielectric spacers 340, 341 on the inner sidewalls 332, 336 of the channel regions 324, 325 of the lower transistors 304, 305, and the third and fourth dielectric spacers 342, 343 on the outer sidewalls 334, 338 of the active channel regions 324, 325 of the lower transistors 304, 305 prevent (or at least mitigate against) the source/drain regions of the lower transistors 304, 305 from growing laterally inward toward each other and toward the interconnect contact 330 or laterally outward away from each other, but the absence of the first and second dielectric spacers 340, 341 on the inner sidewalls 333, 337 of the channel regions 328, 329 of the upper transistors 306, 307 and the absence of the fifth and sixth dielectric spacers 344, 345 permits the source/drain regions of the upper transistors 306, 307 to grow laterally inward toward each other and outward away from each other.

Figure 3D:
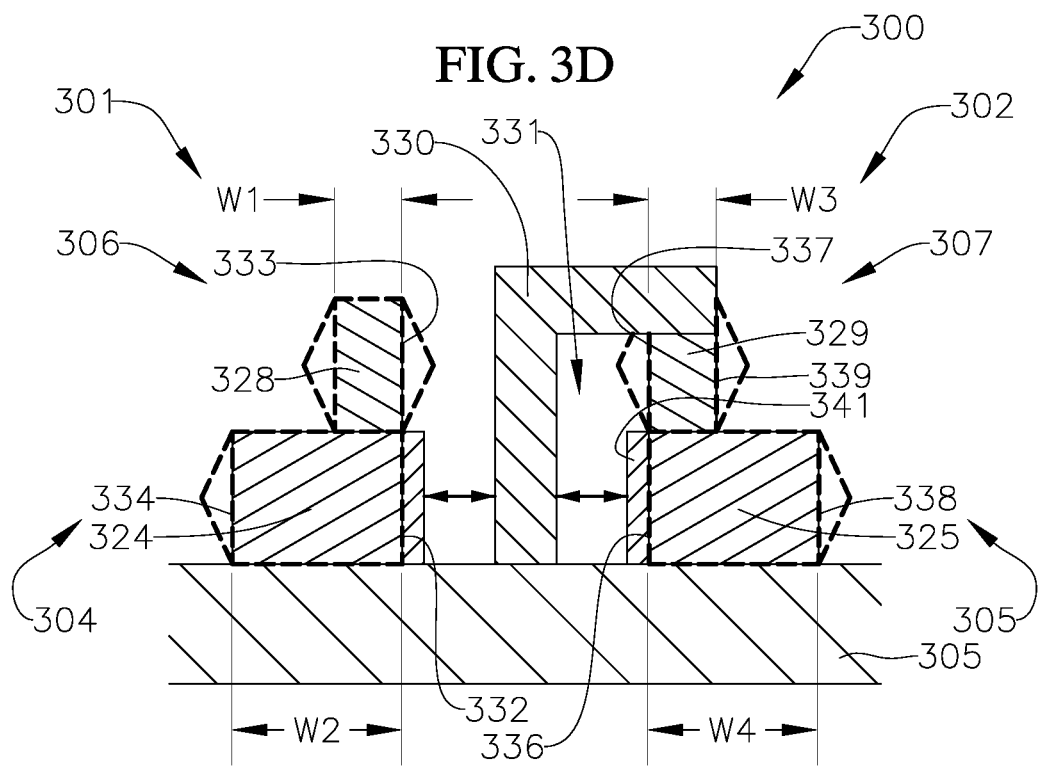

In the embodiment depicted in FIG. 3D, the integrated circuit 300 does not include the third and fourth dielectric spacers 342, 343 on the outer sidewalls 334, 338 of the channel regions 324, 325 of the lower transistors 304, 305 or the fifth and sixth dielectric spacers 344, 345 on the outer sidewalls 335, 339 of the channel regions 328, 329 of the upper transistors 306, 307, and the first and second spaces 340, 341 do not extend along the inner sidewalls 333, 337 of the channel regions 328, 329 of the upper transistors 306, 307 (i.e., dielectric spacers of the integrated circuit 300 include only the first and second dielectric spacers 340, 341 on the inner sidewalls 332, 336 of the channel regions 324, 325 of the lower transistors 304, 305). The dashed lines in FIG. 3D represent the area in which the source/drain regions are confined during epitaxial growth of the source/drain regions. In the embodiment depicted in FIG. 3D, the first and second dielectric spacers 340, 341 on the inner sidewalls 332, 336 of the channel regions 324, 325 of the lower transistors 304, 305 prevent (or at least mitigate against) the source/drain regions of the lower transistors 304, 305 from growing laterally inward toward each other and toward the interconnect contact 330, but the absence of the third, fourth, fifth, and sixth dielectric spacers 342, 343, 344, 345 and the absence of the first and second dielectric spacers 340, 341 on the inner sidewalls 333, 337 of the channel regions 328, 329 of the upper transistors 306, 307 permits the source/drain regions of the upper transistors 306, 307 to grow laterally inward toward each other and the interconnect contact 330 and outward away from each other, and permits the source/drain regions of the lower transistors 304, 305 to grow laterally outward away from each other.

FIG. 4 is a flowchart illustrating tasks of a method 400 of manufacturing an integrated circuit (e.g., one of the integrated circuits 100, 200, or 300 illustrated in FIGS. 1A-1D, FIGS. 2A-2D, and FIGS. 3A-3D, respectively) according to various embodiment of the present disclosure. Each of the first and second semiconductor devices includes a lower transistor and an upper transistor on the lower transistor, and each of the lower transistor and the upper transistor includes a source region, a drain region, and a channel region extending between the source region and the drain region. In one or more embodiments, in each of the first semiconductor device and the second semiconductor device, the channel of the lower transistor has a first length, and the channel of the upper transistor has a second length less than the first length. In one or more embodiments, in each of the first semiconductor device and the second semiconductor device, the channel of the lower transistor and the channel of the upper transistor have the same (or substantially the same) length.

In the illustrated embodiment, the method 400 includes a task 405 of forming the channel regions of the upper and lower channel regions of the first semiconductor device and the second semiconductor device adjacent to the first semiconductor device. In one or more embodiments, the task 405 of forming the channel regions may include covering a semiconductor layer with a photo-resist layer to define areas of the channel regions and then doping those regions (e.g., utilizing arsenic, phosphorous, or antimony to form n-type doped regions or utilizing boron to form p-type doped regions) or by any other suitable techniques or processes known in the art.

In the illustrated embodiment, the method 400 also includes a task 410 of forming dummy gates on the channel regions formed in task 405. The task 410 of forming the dummy gates may include depositing the dummy gates (e.g., by atomic layer deposition (ALD)) and then patterning the dummy gates (e.g., by etching).

In the illustrated embodiment, the method 400 also includes a task 415 of forming a first dielectric spacer extending lengthwise along at least a portion of an inner sidewall of the channel region of at least one of the lower transistor and the upper transistor of the first semiconductor device, and forming a second dielectric spacer facing the first dielectric spacer and extending lengthwise along at least a portion of an inner sidewall of the channel region of at least one of the lower transistor and the upper transistor of the second semiconductor device. In one or more embodiments, the first dielectric spacer formed in task 415 extends lengthwise along at least a portion of the inner sidewall of the channel of both of the lower transistor and the upper transistor of the first semiconductor device, and the second dielectric spacer formed in task 415 extends lengthwise along at least a portion the inner sidewall of the channel of both of the lower transistor and the upper transistor of the second semiconductor device (e.g., as shown in FIGS. 1A-1D and/or 3A-3B). In one or more embodiments, the first dielectric spacer formed in task 415 extends lengthwise along at least a portion of the inner sidewall of the channel of only the lower transistor of the first semiconductor device, and the second dielectric spacer formed in task 415 extends lengthwise along at least a portion of the inner sidewall of the channel of only the lower transistor of the second semiconductor device (e.g., as shown in FIGS. 2A, 2B, 2D, 3C, and 3D). In one or more embodiments, the first dielectric spacer formed in task 415 extends lengthwise along at least a portion of the inner sidewall of the channel of only the upper transistor of the first semiconductor device, and the second dielectric spacer formed in task 415 extends lengthwise along at least a portion of the inner sidewall of the channel of only the upper transistor of the second semiconductor device (e.g., as shown in FIG. 2C). In one or more embodiments, the task 415 of forming the first and second dielectric spacers along the sidewalls of the active channel regions may include conformally depositing a dielectric material on the channel regions and then performing an anisotropic etch to remove the dielectric material except along the desired sidewalls of the channel regions.

In one or more embodiments, the method 400 includes a task 420 of forming a third dielectric spacer extending lengthwise along at least a portion of an outer sidewall of the channel of at least one of the lower transistor and the upper transistor of the first semiconductor device, and forming a fourth dielectric spacer extending lengthwise along at least a portion of an outer sidewall of the channel of at least one of the lower transistor and the upper transistor of the second semiconductor device. In one or more embodiments, the third dielectric spacer formed in task 420 extends along the outer sidewall of the channel of both the lower transistor and the upper transistor of the first semiconductor device, and the fourth dielectric spacer formed in task 420 extends along the outer sidewall of the channel of at least one of the lower transistor and the upper transistor of the second semiconductor device (e.g., as shown in FIGS. 1A, 1C, and 2A). In one or more embodiments, the third dielectric spacer formed in task 420 extends along the outer sidewall of the channel of only the lower transistor of the first semiconductor device, and the fourth dielectric spacer formed in task 420 extends along the outer sidewall of the channel of only the lower transistor of the second semiconductor device (e.g., as shown in FIGS. 2B, 3A, and 3C). In one or more embodiments, the third dielectric spacer formed in task 420 extends along the outer sidewall of the channel of only the upper transistor of the first semiconductor device, and the forming the fourth dielectric spacer formed in task 420 extends along the outer sidewall of the channel of only the upper transistor of the second semiconductor device (e.g., as shown in FIG. 2C). In one or more embodiments, the task 420 of forming the third and fourth dielectric spacers along the sidewalls of the active channel regions may include conformally depositing a dielectric material on the channel regions and then performing an anisotropic etch to remove the dielectric material except along the desired sidewalls of the channel regions. In one or more embodiments, the task 420 of forming the third and fourth dielectric spacers may not be performed (e.g., as shown in FIGS. 1B, 1D, 2D, 3B, and 3D).

In one or more embodiments, the method 400 includes a task 425 of forming a fifth dielectric spacer and a sixth dielectric spacer. In one or more embodiments, the fifth dielectric spacer formed in task 425 may extend lengthwise along at least a portion of the inner sidewall of the channel of upper transistor of the first semiconductor device, and the sixth dielectric spacer formed in task 420 may extend lengthwise along at least a portion of the inner sidewall of the channel of the upper transistor of the second semiconductor device (e.g., as shown in FIG. 2A). In one or more embodiments, forming the fifth dielectric spacer formed in task 425 may extend along the outer sidewall of the channel of upper transistor of the first semiconductor device, and the sixth dielectric spacer formed in task 425 may extend along the outer sidewall of the channel of upper transistor of the second semiconductor device (e.g., as shown in FIG. 3A). In one or more embodiments, the task 425 of forming the fifth and sixth dielectric spacers along the sidewalls of the active channel regions may include conformally depositing a dielectric material on the channel regions and then performing an anisotropic etch to remove the dielectric material except along the desired sidewalls of the channel regions. In one or more embodiments, the task 425 of forming the fifth and sixth dielectric spacers may not be performed (e.g., as shown in FIGS. 1A-1D, 2B-2D, and 3B-3D).

In the illustrated embodiment, the method 400 also includes a task 430 of forming the gates of the transistors. In one or more embodiments, the task 430 may include removing (e.g., by selective etching) the dummy gates formed in task 410 and then conformally depositing a gate metal material on the channel regions of the transistors.

In the illustrated embodiment, the method 400 also includes a task 435 of forming at least one interconnect contact between the first semiconductor device and the second semiconductor device. The interconnect contact(s) may have any suitable configuration, such as, for example, any configuration depicted in FIGS. 1A-3D.

In the illustrated embodiment, the method 400 also includes a task 440 of forming (e.g., by epitaxial growth) the source and drain regions of the transistors. The dielectric spacers formed in tasks 415, 420, and/or 425 are configured to limit the lateral epitaxial growth of the source and drain regions of the semiconductor devices formed in task 440, which enables the semiconductor devices to be spaced closer to each other and/or closer to the interconnect contact formed in task 435 without causing a short (i.e., the dielectric spacers enable the reduction in the spacing between the adjacent semiconductor devices and/or between the semiconductor devices and the interconnect contact that avoids a short). Reducing the size of the spacing between the adjacent semiconductor devices and/or between the semiconductor devices and the interconnect reduces the overall size of the semiconductor cells formed by the method 400 compared to related art semiconductor cells without the dielectric spacers formed in tasks 415, 420, and/or 425.

While this invention has been described in detail with particular references to embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention. One or more of the features described with reference to one embodiment may be combined with one or more features described with another embodiment to provide a workable stacked semiconductor device. Although various mechanisms and structures have been described above to limit the lateral epitaxial growth of the source/drain regions, these mechanisms and structures may be combined in any suitable manner to form a workable stacked semiconductor device.

What is claimed is:

1. An integrated circuit comprising:
a first semiconductor device comprising:
a lower transistor; and
an upper transistor on the lower transistor, each of the lower transistor and the upper transistor comprises a source region, a drain region, and a channel region extending between the source region and the drain region; and
a second semiconductor device adjacent to the first semiconductor device, the second semiconductor device comprising:
a lower transistor; and
an upper transistor on the lower transistor, each of the lower transistor and the upper transistor comprises a source region, a drain region, and a channel region extending between the source region and the drain region;
a first dielectric spacer extending lengthwise along at least a portion of an inner sidewall of the channel region of at least one of the lower transistor and the upper transistor of the first semiconductor device;
a second dielectric spacer facing the first dielectric spacer and extending lengthwise along at least a portion of an inner sidewall of the channel region of at least one of the lower transistor and the upper transistor of the second semiconductor device; and
an interconnect contact between the first semiconductor device and the second semiconductor device.

2. The integrated circuit of claim 1, wherein:
the first dielectric spacer extends along the inner sidewall of the channel region of both of the lower transistor and the upper transistor of the first semiconductor device, and
the second dielectric spacer extends along the inner sidewall of the channel of both of the lower transistor and the upper transistor of the second semiconductor device.

3. The integrated circuit of claim 1, wherein:
the first dielectric spacer extends along the inner sidewall of the channel region of only the lower transistor of the first semiconductor device, and
the second dielectric spacer extends along the inner sidewall of the channel region of only the lower transistor of the second semiconductor device.

4. The integrated circuit of claim 1, wherein:
the first dielectric spacer extends along the inner sidewall of region of only the upper transistor of the first semiconductor device, and
the second dielectric spacer extends along the inner sidewall of the channel region of only the upper transistor of the second semiconductor device.

5. The integrated circuit of claim 1, further comprising:
a third dielectric spacer extending along an outer sidewall of the channel region of at least one of the lower transistor and the upper transistor of the first semiconductor device, and
a fourth dielectric spacer extending along an outer sidewall of region of at least one of the lower transistor and the upper transistor of the second semiconductor device.

6. The integrated circuit of claim 5, wherein:
the third dielectric spacer extends along the outer sidewall of region of both the lower transistor and the upper transistor of the first semiconductor device, and
the fourth dielectric spacer extends along the outer sidewall of the channel region of at least one of the lower transistor and the upper transistor of the second semiconductor device.

7. The integrated circuit of claim 5, wherein:
the third dielectric spacer extends along the outer sidewall of region of only the lower transistor of the first semiconductor device, and
the fourth dielectric spacer extends along the outer sidewall of the channel region of only the lower transistor of the second semiconductor device.

8. The integrated circuit of claim 5, wherein:
the third dielectric spacer extends along the outer sidewall of the channel region of only the upper transistor of the first semiconductor device, and
the fourth dielectric spacer extends along the outer sidewall of the channel region of only the upper transistor of the second semiconductor device.

9. The integrated circuit of claim 5, further comprising:
a fifth dielectric spacer extending along the inner sidewall of the channel region of the upper transistor of the first semiconductor device, and
a sixth dielectric spacer extending along the inner sidewall of the channel region of the upper transistor of the second semiconductor device.

10. The integrated circuit of claim 5, further comprising:
a fifth dielectric spacer extending along the outer sidewall of the channel region of the upper transistor of the first semiconductor device, and
a sixth dielectric spacer extending along the outer sidewall of the channel region of the upper transistor of the second semiconductor device.

11. The integrated circuit of claim 1, wherein, for each of the first semiconductor device and the second semiconductor device, the channel region of the lower transistor has a first length, and the channel region of the upper transistor has a second length less than the first length.

12. The integrated circuit of claim 1, wherein, for each of the first semiconductor device and the second semiconductor device, region of the lower transistor and the channel region of the upper transistor have a same length.

* * * * *